United States Patent [19]

Wozniak et al.

[11] Patent Number: 5,337,016

[45] Date of Patent: Aug. 9, 1994

[54] METHOD AND APPARATUS FOR TRAVELING WAVE ATTENUATION MEASUREMENT

[75] Inventors: Sam Wozniak, Costa Mesa; Hung B. Tran, Orange, both of Calif.; Charles A. Newstrom, Tulsa, Okla.; Pravit Tulyathan, Torrance, Calif.

[73] Assignee: Rockwell International Corporation, Seal Beach, Calif.

[21] Appl. No.: 88,024

[22] Filed: Jul. 9, 1993

[51] Int. Cl.⁵ .................................................. G01S 7/40
[52] U.S. Cl. ...................................... 324/632; 324/627; 324/631; 342/165; 342/4; 343/703
[58] Field of Search .................. 340/531; 342/1, 4, 2, 342/3, 165; 324/632, 631, 627; 343/703

[56] References Cited

U.S. PATENT DOCUMENTS

| | | | |
|---|---|---|---|
| 3,136,946 | 6/1964 | Levine | 324/632 |
| 3,815,019 | 6/1974 | Wiles | 324/632 |
| 4,520,308 | 5/1985 | Rohde | 324/632 |
| 4,634,963 | 1/1987 | Lunden | 324/632 |
| 4,739,249 | 4/1988 | Nyfors | 324/632 |
| 5,229,726 | 7/1993 | Kent | 324/632 |

Primary Examiner—Kenneth A. Wieder
Assistant Examiner—Jose M. Solis
Attorney, Agent, or Firm—Lawrence N. Ginsberg; Charles T. Silberberg

[57] ABSTRACT

A method and apparatus for traveling wave attenuation measurement in the UHF and VHF frequency bands. The test set up comprises a ramp structure located in the quiet zone of a parallel plate set up. The RAM specimen to be tested is attached to the top ramp surface starting at the highest point of the ramp. The time domain signal is gated to reject all scattering except the contribution from the ramp surface. The inverse Fourier transform of the gated time data results in the frequency response of the ramp. The RCS from ramp with RAM material attached is normalized to that of the perfectly conducting surface to provide a relative attenuation of the surface traveling wave.

12 Claims, 3 Drawing Sheets

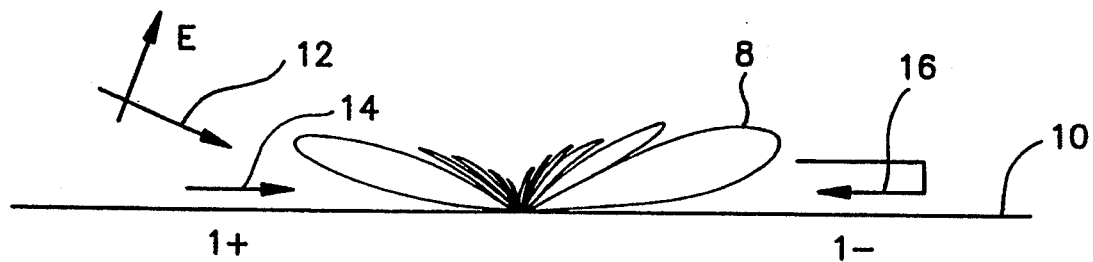
FIG. I (PRIOR ART)
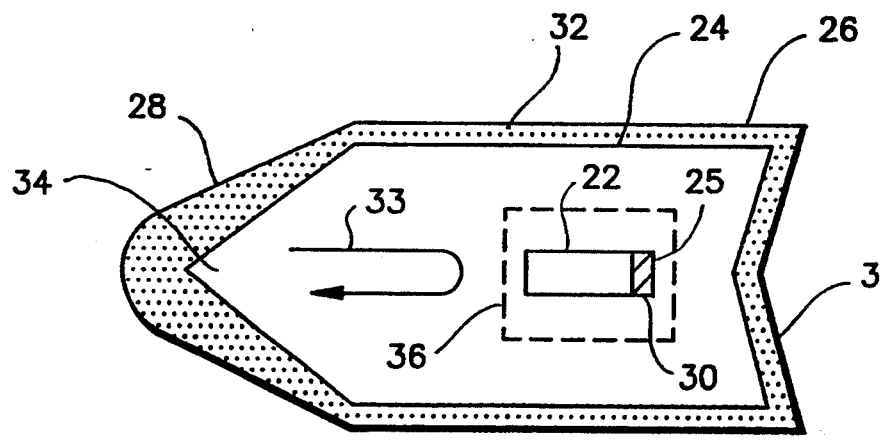
FIG. 2
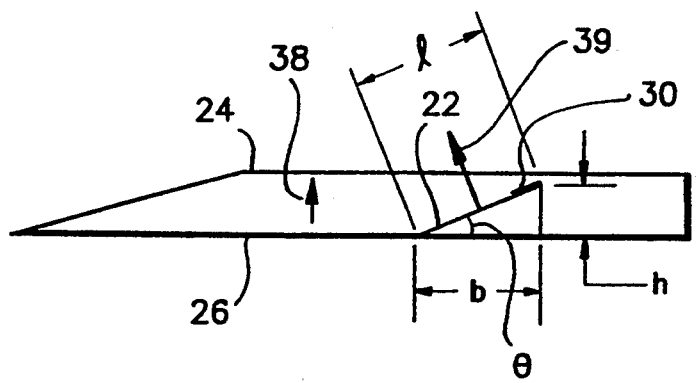
FIG. 3

METHOD AND APPARATUS FOR TRAVELING WAVE ATTENUATION MEASUREMENT

BACKGROUND OF THE INVENTION

1. Field on the Invention

The present invention relates to the measurement of electromagnetic absorption of Radar Absorbing Material (RAM) and more particularly to the measuring of surface traveling wave attenuation.

2. Description of the Related Art

The radar cross section (RCS) due to a surface traveling wave is significant when a long smooth object is illuminated by electromagnetic energy at relatively low angles of incidence (near grazing angle). The traveling wave is launched only if there is a component of the incident electric field tangential to tile surface and in the plane of incidence. The RCS pattern of a long thin structure is discussed in the book entitled "Radar Cross Section," authored by E. F. Knot et al, 1985, pages 147–150 which references the article entitled, "End-Fire Echo Area of Long, Thin Bodies," IRE Trans. Antennas Propag., Vol. AP-6, No. 1, Jan. 1958, pages 133–139 authored by L. Peters, Jr. In this article, a long thin structure is approximated by a thin wire.

Referring now to the figures, FIG. 1 is a reproduction of FIG. 5-12 from the book entitled "Radar Cross Section", with numeral designations added for clarity. The scattering 8 from a thin wire 10 excited by a plane wave 12 is shown in this figure. There exists two current waves, one traveling in the forward direction and one in the backward direction (14 and 16, respectively). The backward traveling current wave 16 will give rise to the same kind of RCS pattern generated by the forward current wave 14, but its location in space will be in the opposite direction. Due to the impedance mismatch at the end of the wire 10 and finite conductivity at the wire surface, the level of the scattering in the backward direction will be less than that in the forward direction.

The backscattered RCS from tile backward current wave in a long, smooth metallic surface is the quantity of interest since the energy is directed back to the radar antenna for the detection of the target. Although the above thin wire analogy assumes a long slender scatterer, the surface wave phenomenon occurs in other structures such as airfoils and missile bodies. In fact, any discontinuity due to the termination of a finite structure or surface discontinuity of a subsection of a larger surface due to seams and gaps can cause this type of scattering.

The maximum RCS of the surface traveling wave for a long slender body is located at the angle approximated by:

$$\theta = 49.35 (\lambda/b)^{\frac{1}{2}} \quad (1)$$

where $\theta$ is the angle (in degrees) from the long axis of the structure, $\lambda$ is the wavelength of tile electromagnetic wave, and b is the length of the body. This location of the first surface traveling wave lobe is important since it has tile highest level of backscatter to the radar receiver.

The suppression of the traveling wave scattering is typically provided by bonding magnetic surface absorbers (magnetic RAM) to the part of the structure that supports the traveling wave. Determination of the effectiveness of the magnetic RAM in suppressing the traveling wave is performed by measuring the RCS of a full scale model of a long thin target that supports the traveling wave. Full scale models are required for this type of measurement since the magnetic RAM material is frequency sensitive. In the UHF and VHF band, where the electrical wavelength is very long, the target can be quite large and the measurement has to be performed in a very large anechoic chamber or outdoor RCS range. The problems associated with such measurement are the high cost of fabricating the model and the rapid roll off of the low frequency signal in the free space environment. In order to reduce the influence of background noise and reflection from other structures (except the target), the time domain reflected signal is processed by a gating procedure to exclude noise and other returns. The limitation to such a technique is that some of the large signals that are outside the range gate but within the digitizer time window is present in the receiver due to the antenna mismatch. The unwanted signal limits the amount of gain for the receiver. This limits the resolution of the signal reflected from the target and usually results in a dynamic range of only 10 to 15 dB.

The limitations described above are eliminated by the use of a parallel plate system for the RCS measurement for two dimensional targets. In this system, the electromagnetic energy is confined between the parallel conducting plates. Since the signal currents are conducted through the conducting skins of the parallel plates the low frequency roll off is extremely small. The parallel plates also offer excellent shielding from other electromagnetic signals that interfere with the outdoor or anechoic ranges.

The common type of measurement in a parallel plate is the specular RCS from a 2 dimensional structure. A section of the 2 dimensional target is placed in the quiet zone of the parallel plate system. This section of the test specimen must have a thickness such that when placed in the parallel plate two flat sides of the specimen are in physical contact with the top and bottom plates. The electromagnetic fields in the parallel plate system comprise plane transverse electromagnetic plane waves, each with a vertically polarized election field (i.e. the direction of the electric field is from the bottom plate to the top plate). Since a traveling wave occurs only when the electric field is in the plane of incidence, an alternative setup had to be developed to evaluate the traveling wave attenuation capability of magnetic materials while using a parallel plate setup.

SUMMARY OF THE INVENTION

The present invention is a method and apparatus for the measurement of the effectiveness of the magnetic RAM material in the attenuation of surface traveling wave. In a broad aspect, the apparatus consists of a ramp positioned in the quiet zone of a parallel plate system. The parallel system comprises an upper plate and a lower parallel plate for reflection measurements of electromagnetic waves scattered from a target located between the plates. Additionally, the parallel plate system comprises an electromagnetic wave generating means for generating plane electromagnetic waves having a direction of propagation. An electric field vector is thereby oriented in a direction perpendicular to the plates. The ramp is positioned between the two parallel plates for supporting a target RAM material. The ramp has a lower end positioned closest to the electromagnetic wave generating means and is in electrical contact with the lower parallel plate. An upper end of the ramp is positioned further away from the electromagnetic wave generating means. The upper end is spaced from the upper parallel plate. The ramp further comprises a reflective surface thereon between the lower end and the upper end. The reflective surface has a normal vector thereto. The normal vector and the direction of propagation form a plane of incidence. The electric field vector has a substantial component In this plane of incidence. Thus, the substantial component generates an electric current traveling on the reflective surface between the lower end and the upper end and commensurate traveling wave scattering of electromagnetic energy.

The return signal due to the scattering from the ramp should contain some electromagnetic energy caused by a surface traveling wave along the top portion of the ramp. The traveling wave is supported in this configuration since the electric field is in the plane of incidence and the termination at the back (upper) end of the ramp creates a backward signal current. Ideally, the angle of the incline for the ramp should be related to the wavelength of the incident plane wave and the length of the ramp by Equation (1), above. In the VHF and UHF band, this requirement usually exceeds the practical parallel plate size since the length of the ramp is limited by the size of the parallel plate and height of the ramp is limited by the plate separation. For frequencies up to 2.1 GHz, the plate separation is kept at approximately 7 inches to prevent the multi-moding of the electromagnetic energy in the higher frequency region. Satisfactory results have also been obtained for the traveling wave measurement in the UHF band for a 6" wide by 60" long ramp with an incline angle of approximately 6 degrees. It is preferred that the angle defined by the reflective surface and a lower parallel plate be in a range of from 5 $(\lambda/b)^{\frac{1}{2}}$ degrees to 50 $(\lambda/b)^{\frac{1}{2}}$ degrees, where $\lambda$ is the wavelength and b is the base defined by the projection of the reflective surface on the lower parallel plate.

BRIEF DESCRIPTION OF THE DRAWINGS

FIG. 1 (Prior Art) illustrates the forward and backward surface traveling wave scattering for a long thin wire.

FIG. 2 is a schematic illustration of a top view of a parallel plate system including a ramp which is placed in the quiet zone to generate a traveling wave scattering component in the return signal, in accordance with the principles of the present invention.

FIG. 3 is a side view of the parallel plate system of FIG. 2.

The same parts throughout the figures of the drawings are designated by the same reference characters.

DETAILED DESCRIPTION OF THE PREFERRED EMBODIMENT

Figure 4:
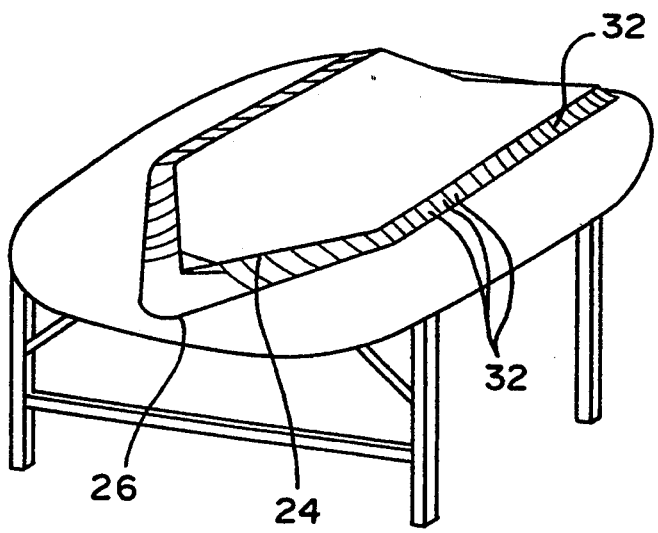
FIG. 4 is a perspective illustration of the parallel plate system of FIG. 2.

Referring again now to the figures of the drawings and the characters of reference marked thereon, FIGS. 2-4 illustrate the apparatus for the measurement of the traveling wave attenuation in a VHF and UHF absorber, in accordance with the principles of the present invention. A ramp 22 is positioned between two parallel plates 24, 26 of a parallel plate system, designated generally as 28. A magnetic RAM specimen 30 is attached on the reflective upper surface of the ramp 22 near the upper end of the ramp 22, with one edge of the specimen 30 next to the upper end of the ramp 22. A gap is maintained between the top plate 24 and the highest point of the ramp 22. The lower end of the ramp 22 is in electrical contact with the lower parallel plate 26. Resistive cards 32 are placed along the edges of the parallel plates to reduce the scattering due to edge diffraction which may reflect back to the target region. These resistive cards 32 are most easily seen in FIG. 4.

A plane transverse electromagnetic (TEM) wave 33 created in between the parallel plates 24, 26 is generated by short stubs 34 which are connected to the centers of coaxial lines from a corporate feed structure (not shown). (It is understood that the present invention may involve the use of only one stub.) Stubs 34 are located at the narrow end of the parallel plate system 28. The feed structure generates a uniform phase front within the quiet zone 36 of the parallel plate setup. The electric field vector 38 is polarized in the direction perpendicular to parallel plates 24, 26, as illustrated in FIG. 3.

The reflective upper surface of the ramp 22 has a normal vector 39. Normal vector 39 and the vector 33 indicating the incoming plane wave direction of propagation form a plane of incidence. The electric field vector 38 should have a substantial component in the plane of incidence, i.e. in the range of 50% to 100% of the magnitude of the electric field vector. In this regard the ramp design should be such that tile RCS from the ramp 22 contains the maximum amount of electromagnetic energy from the surface traveling wave. Thus the maximum traveling wave RCS measured at the receiver occurs with the angle of incline and the length of the ramp described by Equation 1. However, satisfactory traveling wave attenuation measurement for the frequency band from 300 MH$_z$ to 2.1 GH$_z$ has been performed using a ramp with b=60 inches, h=6 inches. This corresponds to an incline angle, $\theta$, of approximately 5 degrees. The parallel plates were 42 feet long and 15 feet wide. They were separated by 7 inches. The gap between the highest point of the ramp and the top plate was one inch.

The target and system frequency response is measured using a vector network analyzer along with a test set and Radio Frequency (RF) source. The data is transformed to the time domain via a chirp Z transform. Applying the propagation constant results in a range profile which then allows identification and isolation of the scattering from the target under test. All other scattering except the target under test is rejected by using the time domain gating. The inverse transform of the reflected time signal results in the frequency response of the described target. Low frequency absorption data is obtained by normalizing the amplitude and phase of the reflection from the target with absorber configuration with that of the same configuration with a perfectly conducting surface.

The measurement of traveling wave attenuation characteristics of RAM materials involves first measuring the reflection of electromagnetic energy from the ramp, without having applied the RAM material, for determining a reference measurement. The return signal due to the scattering from the ramp should contain some electromagnetic energy due to surface traveling wave along the top portion of the ramp. Then, RAM material is placed on the reflective surface near the upper end of the ramp and the reflection of electromagnetic energy from the ramp is measured. The reference measurement may then be compared with the second measurement for determining the attenuation of the traveling wave due to the RAM material.

Figure 5:
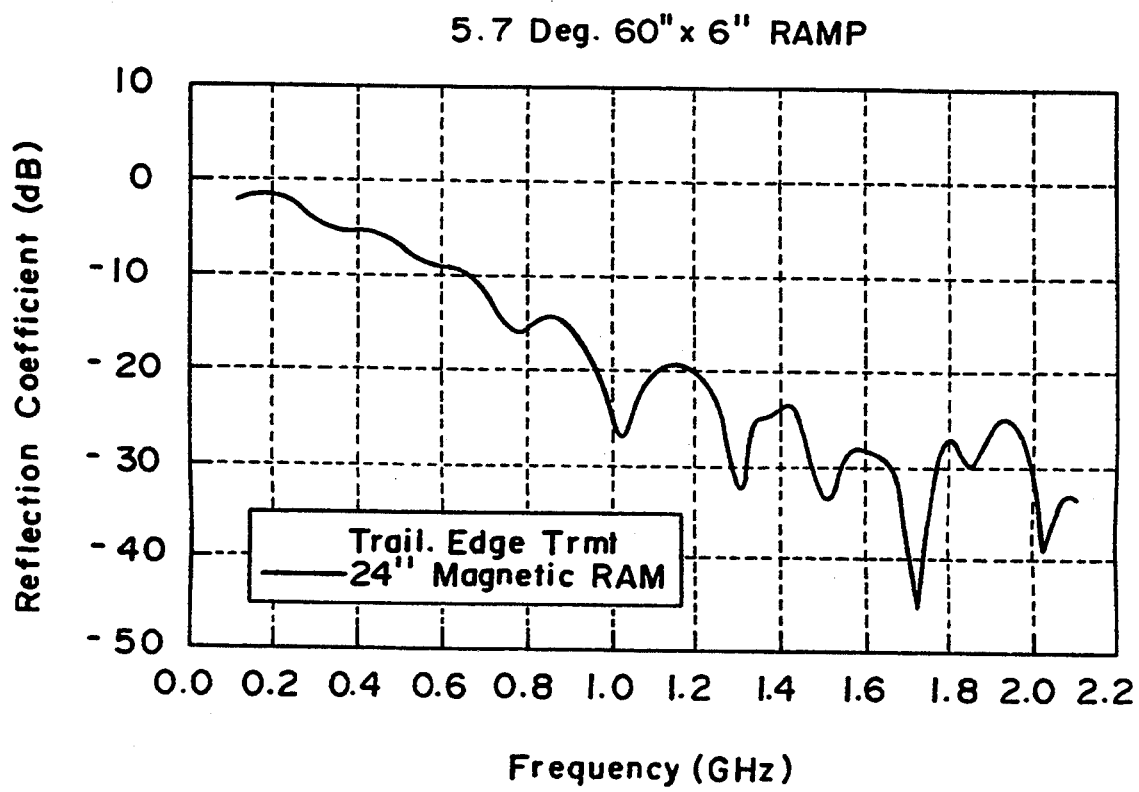
FIG. 5 illustrates RCS measurements for the ramp with ferrite loaded magnetic RAM.

FIG. 5 illustrates the result of the traveling wave attenuation measurement for a standard magnetic RAM material comprising ferrite embedded in a flexible matrix of rubber with a thickness of 0.25" and a length of 24". The dimensions of the parallel plate system and the ramp are as described above. The RCS shown in this figure is normalized to the perfectly conducting ramp surface. Thus the reflection below 0 db is the amount of absorption or attenuation of the reflected electromagnetic energy by the magnetic RAM. Since the ferrite loaded magnetic RAM has the known characteristic of attenuating only surface traveling wave and not the specular returns, the large amount of attenuation shown in FIG. 5, demonstrates that the RCS contents for the ramp contains a significant amount of surface traveling wave.

The data illustrated in FIGS. 5 do not indicate appreciable traveling wave attenuation in the VHF frequency band. This may be due to the fact that the ramp is too short and the incline angle is not large enough to support surface traveling wave in this frequency band. However, it is also possible that the ferrite loaded magnetic RAM is not capable of such attenuation in the VHF band.

Obviously, many modifications and variations of the present invention are possible in light of the above teachings. It is, therefore, to be understood that, within the scope of the appended claims, the invention may be practiced otherwise than as specifically described.

Figure 6:
FIG. 6 illustrates an alternate ramp design with a straight incline portion and straight termination portion forming an angle other than 90 degrees from the base.
Figure 7:
FIG. 7 illustrates use of another alternate ramp having a straight incline portion and a curved termination portion.
Figure 8:
FIG. 8 illustrates use of another alternate ramp having a curved incline and vertical termination.
Figure 9:
FIG. 9 illustrates another alternate ramp with a curved incline and a curved termination.
Figure 10:
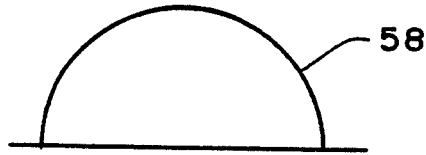
FIG. 10 illustrates use of a circular incline.
Figure 11:
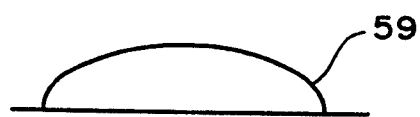
FIG. 11 illustrates use of an elliptical incline.
Figure 12:
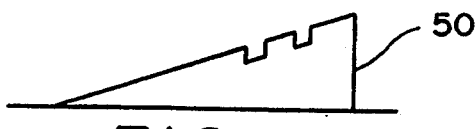
FIGS. 12-18 illustrate the use of gaps or cracks in the surface of the ramps of FIG. 6-11 to generate surface traveling waves. (This configuration can also be used to measure the effectiveness of the RAM material for suppressing the scattering due to the gap.)
Figure 13:
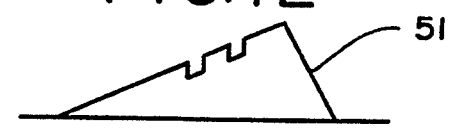
Figure 14:
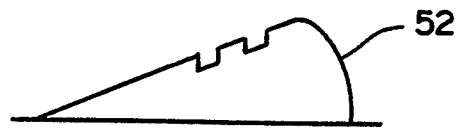
Figure 15:
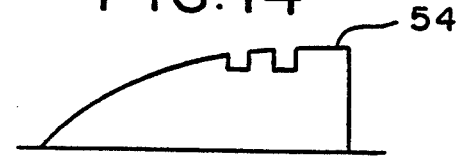
Figure 16:
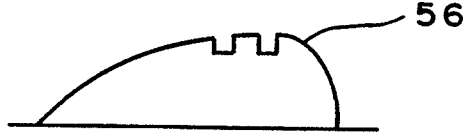
Figure 17:
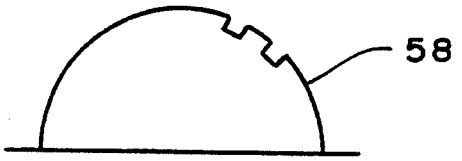
Figure 18:

For example, although the above discussion concentrated mainly on a straight ramp structure with a straight termination portion placed inside a parallel plate test set up, as illustrated in FIG. 2, other ramp structures may also be used. Such ramp designs may include a straight incline with a straight termination forming an angle other than 90 degrees from surface 51 (FIG. 6), straight incline with a curved termination portion 52 (FIG. 7), curved incline and straight vertical termination portion 54 (FIG. 8), curved incline and curved termination portion 56, circular incline 58 (FIG. 9), and elliptical incline 59 (FIG. 11). In addition, the curvature of the ramp surface may be in the longitudinal or orthogonal direction, or both.

Alternate ramp configurations may also include one or more gaps, cracks, or crenelations on the ramp surface which may modify the surface wave characteristic of a smooth ramp surface, as illustrated in FIGS. 12-18.

These configurations can also be used to measure the effectiveness of the RAM material for suppressing the scattering due to the gaps. What remains critical for the purposes of implementing this invention is the use of a ramped device in the parallel plate that supports a surface traveling wave.

What is claimed and desired to be secured by Letters Patent of the United States:

1. An apparatus for the measurement of the traveling wave attenuation characteristics of RAM materials, comprising:
   a) a parallel plate system comprising an upper parallel plate and a lower parallel plate, for reflection measurements of electromagnetic waves scattered from a target located between said plates, said parallel plate system further comprising:
      electromagnetic wave generating means for generating plane electromagnetic waves having a direction of propagation, said electromagnetic waves further having an electric field vector oriented in a direction perpendicular to said parallel plates; and,
   b) a ramp positioned between said two parallel plates for supporting a target RAM material, said ramp having a lower end positioned closest to said electromagnetic wave generating means and being in electrical contact with said lower parallel plate, and an upper end positioned further away from said electromagnetic wave generating means, said upper end being spaced from said upper parallel plate,
      said ramp further comprising a reflective surface thereon between said lower end and said upper end, said reflective surface having a normal vector thereto, said normal vector and said direction of propagation forming a plane of incidence, said electric field vector having a substantial component in said plane of incidence, said substantial component thereby generating an electric current traveling on said reflective surface between said lower end and said upper end and commensurate traveling wave scattering of electromagnetic energy.

2. The apparatus of claim 1, wherein said component of said electric field vector in said plane of incidence is in the range of 50% to 100% of the magnitude of said electric field vector.

3. The apparatus of claim 1 wherein an angle defined by said reflective surface and said lower parallel plate is in a range of from 5 $(\lambda/b)^{\frac{1}{2}}$ degrees to 50 $(\lambda/b)^{\frac{1}{2}}$ degrees, where $\lambda$ is the wavelength and b is the base defined by the projection of the reflective surface on the lower parallel plate.

4. The apparatus of claim 1 wherein said reflective surface is substantially planar.

5. The apparatus of claim 1 wherein said ramp comprises a termination portion on a back side of said ramp for connecting said upper end to said lower plate, said termination portion forming substantially a 90 degree angle with said lower parallel plate.

6. The apparatus of claim 1 wherein said ramp comprises a termination portion on a back side of said ramp for connecting said upper end to said lower plate, said termination portion being curved.

7. The apparatus of claim 1 wherein said reflective surface is curved.

8. The apparatus of claim 1 wherein said reflective surface is elliptically curved.

9. The apparatus of claim 1 wherein said reflective surface is circular.

10. The apparatus of claim 1 wherein said reflective surface is smooth.

11. The apparatus of claim 1 wherein said reflective surface is crenelated.

12. A method for measuring the traveling wave attenuation characteristics of RAM materials, comprising the steps of:
a) providing a parallel plate system comprising an upper parallel plate and a lower parallel plate, for reflection measurements of electromagnetic waves scattered from a target located between said plates, said parallel plate system further comprising:
   i) electromagnetic wave generating means for generating plane electromagnetic waves having a direction of propagation, said electromagnetic waves further having an electric field vector oriented in a direction perpendicular to said parallel plates; and,
   ii) ramp positioned between said two parallel plates for supporting a target RAM material, said ramp having a lower end positioned closest to said electromagnetic wave generating means and being in electrical contact with said lower parallel plate, and an upper end positioned further away from said electromagnetic wave generating means, said upper end being spaced from said upper parallel plate, said ramp further comprising a reflective surface thereon between said lower end and said upper end, said reflective surface having a normal vector thereto, said normal vector and said direction of propagation forming a plane of incidence, said electric field vector having a substantial component in said plane of incidence, said substantial component thereby generating an electric current traveling on said reflective surface between said lower end and said upper end and commensurate traveling wave scattering of electromagnetic energy, when said electromagnetic wave generating means is applied;

b) measuring tile reflection of electromagnetic energy from said ramp for determining a reference measurement;

c) placing RAM material on said reflective surface near said upper end of said ramp and measuring the reflection of electromagnetic energy from said ramp; and, d) comparing said reference measurement with said measurement obtained when the RAM material was placed on said reflective surface for determining the attenuation of the traveling wave due to the RAM material.

* * * * *